(12) United States Patent
Quilligan et al.

(10) Patent No.: US 9,985,594 B2
(45) Date of Patent: May 29, 2018

(54) GATED CDS INTEGRATOR

(71) Applicant: The United States of America as represented by the Administrator of the National Aeronautics and Space Administration, Washington, DC (US)

(72) Inventors: Gerard T. Quilligan, Gulf Breeze, FL (US); Shahid Aslam, Washington, DC (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 79 days.

(21) Appl. No.: 14/847,907

(22) Filed: Sep. 8, 2015

(65) Prior Publication Data
US 2016/0294332 A1 Oct. 6, 2016

Related U.S. Application Data

(60) Provisional application No. 62/142,017, filed on Apr. 2, 2015.

(51) Int. Cl.
G06F 7/64 (2006.01)
H03F 3/387 (2006.01)
H03F 1/26 (2006.01)
H03F 3/45 (2006.01)
H03F 3/72 (2006.01)
H03G 3/20 (2006.01)

(52) U.S. Cl.
CPC ............ *H03F 3/387* (2013.01); *H03F 1/26* (2013.01); *H03F 3/45475* (2013.01); *H03F 3/45596* (2013.01); *H03F 3/72* (2013.01); *H03G 3/20* (2013.01); *H03F 2200/264* (2013.01); *H03F 2200/271* (2013.01); *H03F 2200/372* (2013.01); *H03F 2203/45212* (2013.01); *H03F 2203/45288* (2013.01); *H03F 2203/45514* (2013.01)

(58) Field of Classification Search
CPC ....... H01L 2924/00; H01L 2924/48247; H01L 2924/00014; H01L 2924/00012; H01L 2924/73265
See application file for complete search history.

(56) References Cited

U.S. PATENT DOCUMENTS

| 2002/0140589 A1* | 10/2002 | Bazarjani | H03M 3/496 341/143 |
| 2003/0222661 A1* | 12/2003 | Fasen | G01D 5/24 324/662 |
| 2016/0006417 A1* | 1/2016 | Kim | H03K 3/01 327/108 |

* cited by examiner

*Primary Examiner* — Sibin Chen
(74) *Attorney, Agent, or Firm* — Christopher O. Edwards; Bryan A. Geurts; Mark P. Dvorscak

(57) ABSTRACT

A Gated CDS Integrator (GCI) may amplify low-level signals without introducing excessive offset and noise. The GCI may also amplify the low level signals with accurate and variable gain. The GCI may include a modulator preceding a linear amplifier such that offset or noise present in a signal path between the modulator and a demodulator input is translated to a higher out of band frequency.

16 Claims, 4 Drawing Sheets

GATED CDS INTEGRATOR

STATEMENT OF FEDERAL RIGHTS

The invention described herein was made by employees of the United States Government and may be manufactured and used by or for the Government for Government purposes without the payment of any royalties thereon or therefore.

FIELD

The present invention generally relates to a Gated CDS Integrator (GCI), and more particularly, a GCI to amplify low-level signals.

BACKGROUND

A common pre-processing step in the digitization of microvolt level signals is amplification with filtering. The signal amplitudes must be increased well in excess of a digitizer's least significant bit (LSB) size so that the quantization noise is negligible when compared to the amplified signal. The required amplification can thus exceed a thousand when working with microvolt level signals. Offsets and 1/f noise in the front-end amplifier are also subject to the same gain, and if they are comparable to the input signal, they can swamp the signal so it is not resolvable or, in the worst case, saturate the amplifier. The presence of thermal noise in the amplifier chain also contributes to the loss of signal fidelity.

Chopper stabilization is a classic technique that is used to lower the offset and 1/f noise in a high gain amplifier. While the chopping circuitry itself is relatively straightforward, i.e. it is comprised of clocked switches before and after the amplifier chain, continuous time low pass filtering and clock delay equalization (to account for the delay through the amplifier chain) must be applied to retrieve the translated signal. Certain implementations also incorporate bandpass filtering into the amplifier chain to reduce the amplifier offset and 1/f noise even further. These circuits are also susceptible to transient noise associated with the switching action of the modulator.

The front-end amplifier offset and 1/f noise may also be reduced by auto-zero techniques. In contrast to the chopper approach, which uses frequency translation, auto-zeroing is a sampling technique where the offset and 1/f noise is stored either on a capacitor or in a digital-analog converter's register and then subtracted from the signal. Auto-zero techniques utilize either a negative feedback loop or a sample-hold to acquire the offset and 1/f noise for eventual correction. The auto-zero approach requires that the offset be periodically sensed and stored through shorting of the amplifier's inputs to a common mode voltage. Thereafter, when the amplifier is operating to amplify the signal, the auto-zero correction is applied. Auto-zero methods have the disadvantage of white noise folding into the signal passband due to the sampling aspect of the technique.

Thus, an alternative approach may be beneficial.

SUMMARY

Certain embodiments of the present invention may provide solutions to the problems and needs in the art that have not yet been fully identified, appreciated, or solved by conventional image processing algorithms. For example, some embodiments of the present invention pertain to a GCI to amplify low-level signals without introducing offset and noise while having accurate and variable gain.

In certain embodiments, a sensor, such as a thermopile array, provides multiple outputs and the outputs must be read out simultaneously as a 'frame'. In those embodiments, there may be multiple amplifier channels with high gain, low offset and noise. In such embodiments, it is desirable to process a plurality of inputs in parallel with the same gain and frequency response while minimizing the number of digitizers for power, area and cost reasons.

In certain embodiments, a sensor, such as a thermopile array, provides multiple outputs and the outputs must be read out simultaneously as a 'frame'. In these embodiments, it is desirable to have multiple channels operating simultaneously to amplify the plurality of inputs with high gain, low offset and noise. Also, in these embodiments, the outputs are multiplexed to a single analog to digital converter (ADC) for digitization.

In an embodiment, an apparatus includes a modulator preceding a linear amplifier such that offset or noise present in a signal path between the modulator and a demodulator input is translated to a higher out of band frequency.

In another embodiment, an apparatus includes a Gated CDS Integrator that processes a signal with correlated double sampling and discrete time lossy integration to reduce offset, 1/f, Johnson, and shot noise. The Gated CDS Integrator may also digitally control discrete time amplification, and demodulate and filter the chopped signal.

In yet another embodiment, a Gated CDS Integrator may include a modulator preceding a linear amplifier such that any offset or 1/f noise present in a signal path between the modulator and a correlated double sampling integrator is rejected.

BRIEF DESCRIPTION OF THE DRAWINGS

In order that the advantages of certain embodiments of the invention will be readily understood, a more particular description of the invention briefly described above will be rendered by reference to specific embodiments that are illustrated in the appended drawings. While it should be understood that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE EMBODIMENTS

Figure 1:
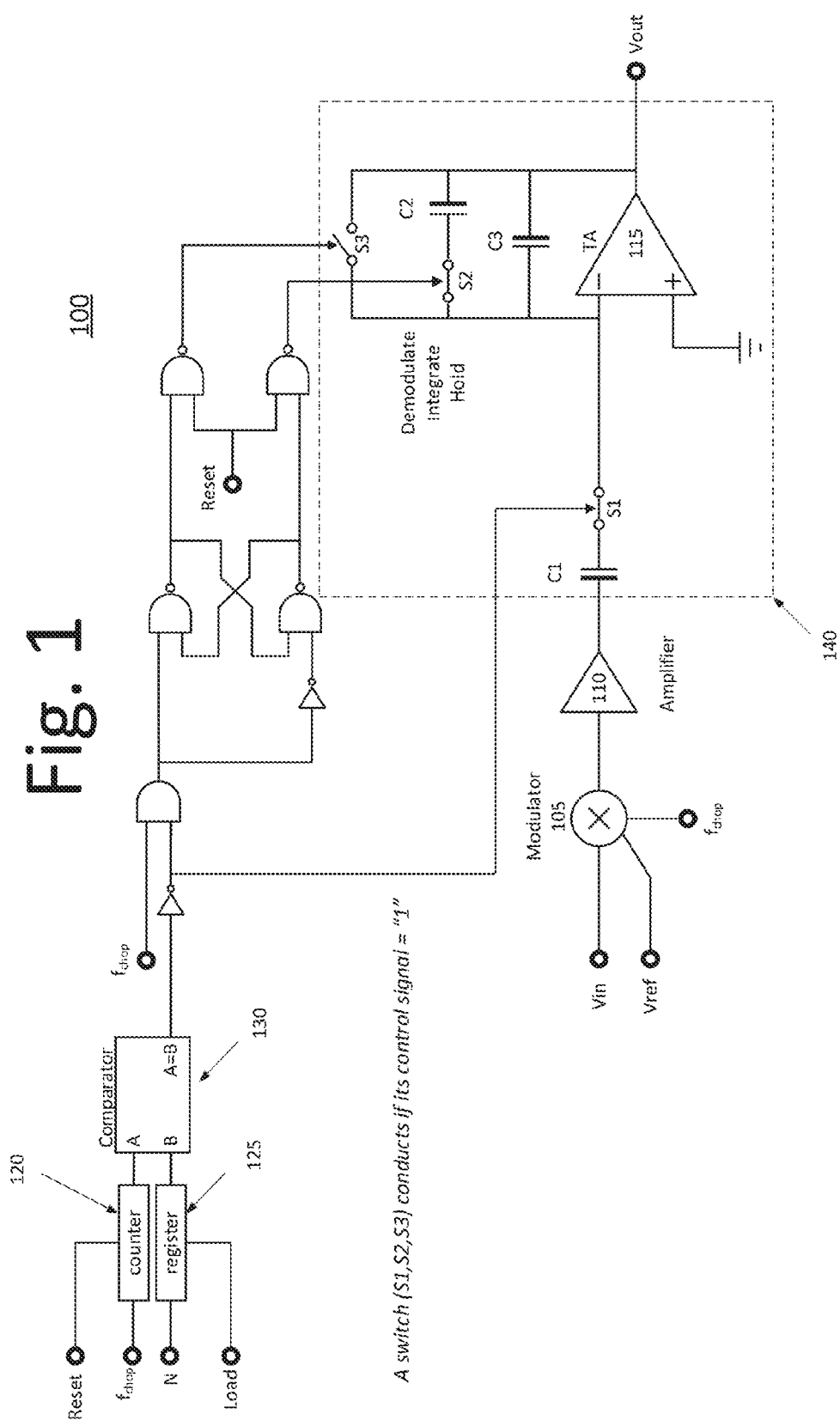
FIG. 1 is a block diagram illustrating a GCI, according to an embodiment of the present invention.

Some embodiments of the present invention pertain to a GCI that may amplify low-level signals without introducing excessive offset and noise. The GCI may also amplify the low level signals with accurate and variable gain. In some embodiments, after a counter and integrator have been reset, a first switch is closed and the integrator demodulates the signal present at the output of the amplifier between a modulator and a first capacitor. With each cycle of $F_{chop}$, a second capacitor in a feedback loop of the integrator accumulates charge from the first capacitor. When the counter reaches a value N, a first switch and a third switch are opened, and a second switch is closed. This allows the integrator to hold the accumulated charge, which can be digitized by an ADC.

In certain embodiments, the GCI 100 is one of a plurality of GCI 100s which outputs can be sequentially or synchronously digitized. In other embodiments, the GCI 100 is one of a plurality of GCI 100s which outputs when held can be sequentially or synchronously digitized. In yet other embodiments, the GCI 100 is one of a plurality of GCI 100s which outputs when held can be multiplexed and sequentially digitized.

The total ideal gain of the GCI 100 may be as high as A×N, where A is the amplifier's gain, and N is the number of cycles that the integrator integrates. In some embodiments, the gain N of the circuit may be intentionally limited by a lossy response in the integrator. In other embodiments, N may be a variable so the total gain is a variable. In other embodiments, the gain N may be limited by the non-ideal response of the integrator due to finite open-loop gain. In yet other embodiments, the gain N may be limited by the lossy integrator response due to the partial overlap of the clock signals to the GCI switches S2/S3.

The offset and 1/f noise of the amplifier may be reduced by the demodulation action of the integrator. The integrator itself may include an auto-zero implementation such that the effects of its own offset are automatically reduced by the sample and/or integrate action. The $F_{chop}$ signal ideally is a square wave signal with a fifty percent duty cycle. The higher $F_{chop}$, the lower the corrected offset and 1/f noise.

The reduction of the offset of the amplifier is very efficient and the technique lends itself to be radiation hardened. Since the total dose can change the offset due to varying threshold voltages of complementary metal-oxide semiconductor (CMOS) transistors, the circuit shown in FIG. 1 may adapt and compensate for any variations. The integrator in some embodiments may also be configured to adapt to its own varying offsets. The net outcome is variable and accurate gain which is very robust to power supply variation, radiation effects, and aging.

It should be appreciated that digitizing microvolt level direct current (DC) signals requires that the effects of offset, offset drift and 1/f noise be minimized with circuit topologies that cancel, filter or translate the errors to out of band frequencies. These topologies also need to be resistant to radiation effects where the application is for spaceflight. Radiation effects tend to degrade the noise and offset performance in high total ionizing dose environments, where the cumulative dose can far exceed 1 Mrad (Si).

FIG. 1 is a block diagram illustrating a GCI 100, according to an embodiment of the present invention. FIG. 1 is a single-ended implementation of the GCI 100, but it will be obvious to those skilled in the art that GCI 100 could be implemented as a fully balanced differential topology where modulator 105, amplifier 110, and CDS-integrator 140 are all fully balanced differential circuits. A fully balanced differential implementation offers rejection of common-mode and even order distortion artifacts (e.g. such as generated by non-linear CMOS switch charge injection).

In some embodiments, GCI 100 of FIG. 1 can perform signal processing in a radiation hardened application specific integrated circuit (ASIC). It should be appreciated that GCI 100 may receive inputs from a variety of sources, such as a thermopile, a bolometer, an accelerometer or a pressure sensor, to name several examples, and a person of ordinary skill in the art would appreciate this. GCI 100 combines chopping with correlated double sampling (CDS) and discrete time lossy integration to reduce offset, 1/f, Johnson and shot noise. While chopping is a technique used to reduce 1/f noise and offsets, GCI 100 implements digitally controlled discrete time amplification and simultaneously demodulates and filters a chopped amplified signal. GCI 100 also combines demodulation with CDS, discrete time integration and auto-zeroing. The combination of CDS and integration circuit functions is referred to as a CDS-integrator 140 because these two functions are merged into one composite function in certain embodiments. When the CDS-integrator 140 is combined with the logic circuitry enabling the count-compare-hold functions, the ensemble circuit 100 is called a Gated CDS Integrator or GCI.

In some embodiments, both continuous and discrete time (DT) amplification are used to realize very high and precise gain. High continuous time (CT) gain can minimize residual input referred integrator and post-amplifier offsets. The CT amplification may be performed by, for example, a linear amplifier, and DT amplification may be performed by, for example, a discrete time integrator. The output of the GCI may be digitized in some embodiments by an ADC.

GCI 100 in some embodiments may amplify a DC input signal with minimal offset and noise, and hold the result for digitization by an ADC. The analog processing sequence from analog input to analog output is modulate, amplify, demodulate, integrate and hold. While GCI 100 reduces offsets and 1/f noise to negligible levels, the signal path voltage levels can still reach saturation levels if the gain is high enough. This is due to the linear amplifier having a non-zero offset and 1/f noise, which it will amplify. GCI may eliminate this problem by using an auto-zero circuit between the linear amplifier and the CDS-integrator circuits.

GCI 100 may include a modulator 105 that chops an input signal into a square wave, with period $T_{chop}$ alternating between input voltage $V_{in}$ and $V_{ref}$. In some embodiments, the $V_{ref}$ voltage may be equal to 0V. In other embodiments, the $V_{ref}$ voltage may be equal to any voltage within the input common-mode range of the amplifier. The chopping action translates the input signal up to harmonics of the chop clock frequency. In addition to modulator 105, GCI 100 includes a linear amplifier 110, capacitors C1, C2, C3, a transconductance amplifier (TA) 115, switches S1, S2, S3, and logic circuits.

In this embodiment, modulator 105 precedes linear amplifier 110. This way, any offset or 1/f noise present in the signal path between modulator 105 and CDS-integrator 140 is rejected due to the inherent CDS high pass filter function when demodulated while the amplified input signal is re-translated back to the baseband. It will be noted by those skilled in the art that any DC and/or low frequency components of amplifier 110's output will be completely or partially rejected by capacitor C1 and only higher frequency components of the output signal will be coupled to the virtual ground node of the CDS-integrator. GCI 100 in some embodiments uses bottom plate sampling. In such an embodiment, the bottom plates of the sample and integrating capacitors are connected to their respective driving amplifier's outputs. Any parasitic non-linear capacitances on the bottom plates of C1, C2 and C3 appear as loads on the output of amplifier 110 and the output of TA 115 and do not degrade linearity.

The operation of GCI 100 is controlled by logic circuits that implement a count and compare operation along with non-overlapping clock signals for modulator 105 and CDS-integrator 140. A comparator 130 compares the outputs of a counter 120 and a register 125. Register 125 is loaded with an integer value N on the active edge of the logic signal Load. Counter 120, after being reset, counts the number of chopper clock cycles. When counter 120 and register 125 outputs are the same, comparator 130 outputs a logic 1 and switches S1 and S3 are opened, and switch S2 is closed. This places CDS-integrator 140 in hold mode. This allows the held voltage on the bottom plates of capacitors C2 and C3 to be read by a digitizer. When digitization is complete, counter 120 and CDS-integrator 140 are reset by a Reset logic signal. A logic 0 for Reset forces switches S2 and S3 to be closed simultaneously such that the held voltage on the capacitors C2 and C3 in the integrator feedback loop are fully discharged.

When GCI 100 is operating in CDS-integration mode, switch S1 is closed and the chop signal is toggling switches S2 and S3 with non-overlapping clock signals. This way, when switch S2 is closed, S3 is open and vice versa. When the chop signal is a logic 1, switch S3 is closed and switch S2 is open. The TA 115 output is then equal to zero volts plus its own offset voltage equal to $V_{io}$. The difference between the bottom and top plate voltages of capacitor C1 is stored on capacitor C1, which is the sampling capacitor to the left of switch S1 in FIG. 1. In the following equations, A is the linear amplifier's CT gain, $V_n$ is the linear amplifier's offset plus 1/f noise, $V_{io}$ is the integrator amplifier offset and m is a discrete time integer. In some embodiments, m ranges from 0 to N, and when m=N, the integration activity ends and GCI 100 enters hold mode. Thus, in the intervals m and m+0.5 (one half cycle later)

$$V_{C1_m} = A(Vin_m + Vn_m) - V_{io} \quad \text{Equation (1)}$$

$$V_{C1_{m+0.5}} = A(Vin_{m+0.5} + Vn_{m+0.5}) - V_{io} \quad \text{Equation (2)}$$

If the clock interval is small enough with respect to the amplifier path time constant, then $$Vn_{m+0.5} \approx Vn_m \quad \text{Equation (3)}$$

which is the fundamental assumption of correlated double sampling. In addition, in this embodiment, the chopping action sets $Vin_{m+0.5}$ to 0V, and the charge on capacitor C1 during intervals m and m+0.5 is:

$$Q_{C1_m} = C_1[A(Vin_m + Vn_m) - V_{io}] \quad \text{Equation (4)}$$

$$Q_{C1_{m+0.5}} = C_1[A(0 + Vn_m) - V_{io}] \quad \text{Equation (5)}$$

The difference in charge between the intervals is given as:

$$\Delta Q_{C1} = Q_{C1_{m+0.5}} - Q_{C1_m} = -C_1[A(Vin_m)] \quad \text{Equation (6)}$$

This charge difference is distributed onto capacitors C2 and C3 during the m+0.5 interval (chop signal=0). This process is repeated while comparator 130 output is zero. Because of the inverting topology of CDS-integrator 140, the voltage on the bottom plates of capacitors C2 and C3 takes an opposite sign to the charge difference transferred from capacitor C1. The voltage on capacitor C2 accumulates until the count N is reached and then it is held.

Capacitor C3 is a 'lossy' element in certain embodiments. During sampling, when capacitor C1 is being charged, capacitor C3 is being discharged. The amount of charge lost from capacitor C3 in interval m is proportional to its value and the value of the integrated voltage at time m−1. The presence of capacitor C3 limits the gain of the integrator and creates a low pass filter to reduce thermal (Johnson) noise. Without capacitor C3, the integrator gain would be too large for any reasonable filtering action to occur.

In some embodiments, capacitor C1 is charged between the outputs of two amplifiers during the sampling phase (chop signal=1). In other embodiments, a common mode (CM) voltage may be on the top plate of capacitor C1 for charging. This may necessitate a dedicated CM buffer.

The total gain from input to output is given as:

$$A_V = A \times A_I \quad \text{Equation (7)}$$

$A_I$ is the gain of CDS-integrator 140 and incorporates the affects of non-ideal open-loop gain, lossiness due to capacitor C3, lossiness due to any overlap of controlling clocks and parasitic elements. CDS-integrator 140 may be intentionally lossy in certain embodiments to limit this gain, which is generally limited to a maximum ideal value of N.

Derivation of GCI Gain

The CDS-integrator response can be described by a difference equation in certain embodiments, given as:

$$y_n = ax_n + y_{n-1} - by_{n-1} \quad \text{Equation (8)}$$

where $x_n$ is the value of the input voltage at discrete interval n and $y_n$ is the value of the output voltage at n. The variables a and b are defined as:

$$a = \frac{C1}{C2 + C3} \text{ and } b = \frac{C3}{C2 + C3} \quad \text{Equation (9)}$$

where C1, C2 and C3 represent the values of the capacitors in GCI 100.

The above equation for $y_n$ is recursive, and to obtain a closed form, the right hand side must be summed for all N:

$$y_n = \Sigma_{n=0}^{N} ax_n(1-b)^n \quad \text{Equation (10)}$$

Defining $x_n = u_n$, a step function (i.e. for n<0, $u_n = 0$; for n>=0, $u_n = u_0$), then $$y_n = au_0 \Sigma_{n=0}^{N} (1-b)^n \quad \text{Equation (11)}$$

Using the formula for the sum of a geometric series:

$$\sum_{n=0}^{N} r^n = \frac{1 - r^{N+1}}{1 - r} \quad \text{Equation (12)}$$

$$y_n = au_0 \left[ \frac{1 - (1-b)^{N+1}}{1 - (1-b)} \right] = \frac{au_0[1 - (1-b)^{N+1}]}{b} \quad \text{Equation (13)}$$

Since $p^m = e^{-\sigma m}$ with $\sigma = -\ln(p)$:

$$y_n = \frac{au_0}{b}(1 - e^{(N+1)\ln(1-b)}) \quad \text{Equation (14)}$$

The equation for $y_n$ describes a single pole low pass filter with an asymptotic value of $$\frac{au_0}{b}.$$

The 10 percent to 90 percent rise time $t_r$ in seconds is:

$$tr = \left| \frac{2.198 \, T_{chop}}{\ln(1-b)} \right| \quad \text{Equation (15)}$$

Bandwidth BW may be computed from the 10 percent to 90 percent rise time. The integrator −3 dB bandwidth is:

$$BW = \left| \frac{\ln(1-b)}{2\pi\, T_{chop}} \right| \quad \text{Equation (16)}$$

The difference equation when transformed into the Z-domain yields:

$$y_z = \frac{ax_z}{(1-b)} \frac{1}{\left(\frac{1}{1-b}\right) - z^{-1}} = x_z \frac{C_1}{C_2} \frac{1}{\left(1 + \frac{C_3}{C_2}\right) - z^{-1}} \quad \text{Equation (17)}$$

$$H_z = \frac{C_1}{C_2} \frac{1}{\left(1 + \frac{C_3}{C_2}\right) - z^{-1}} \quad \text{Equation (18)}$$

Figure 2:
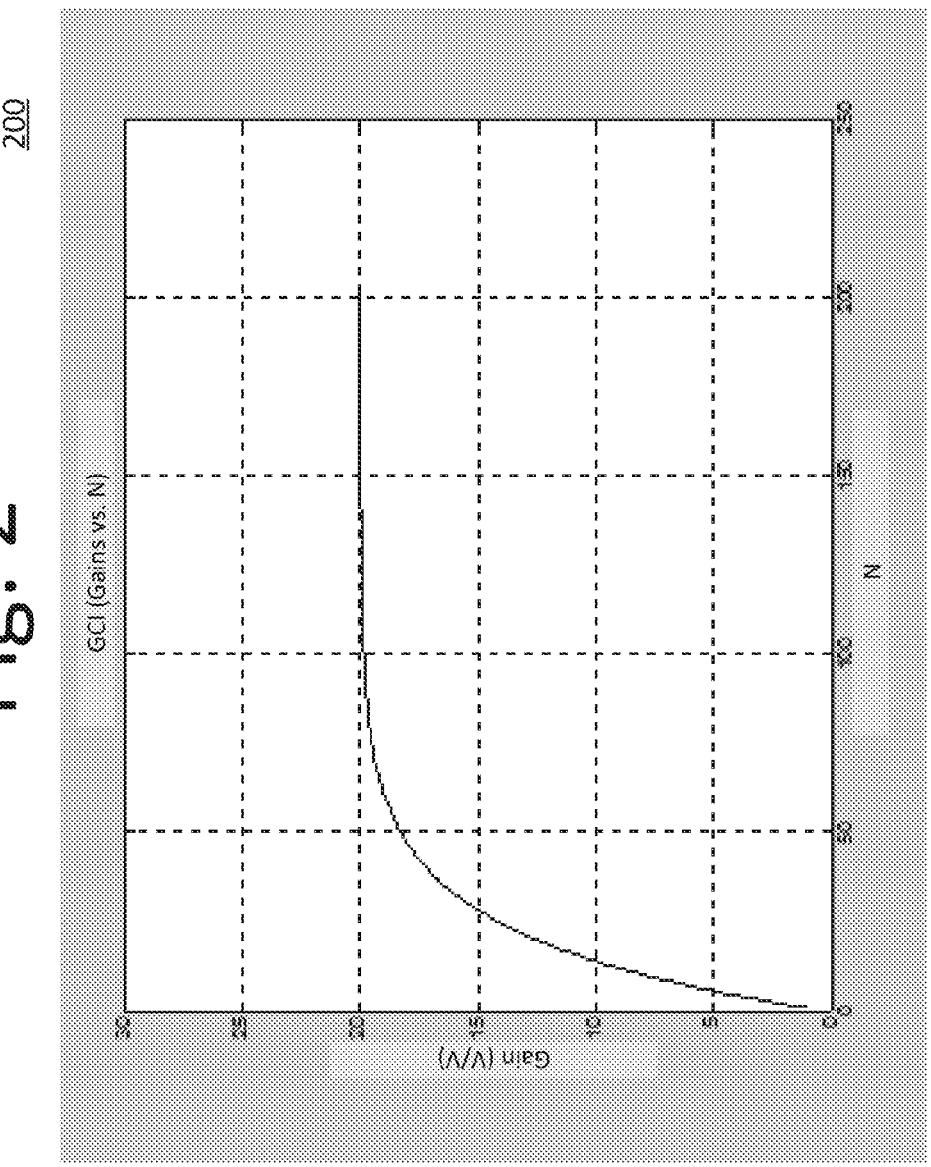
FIG. 2 is a graph illustrating a GCI gain versus N, according to an embodiment of the present invention.
Figure 3:
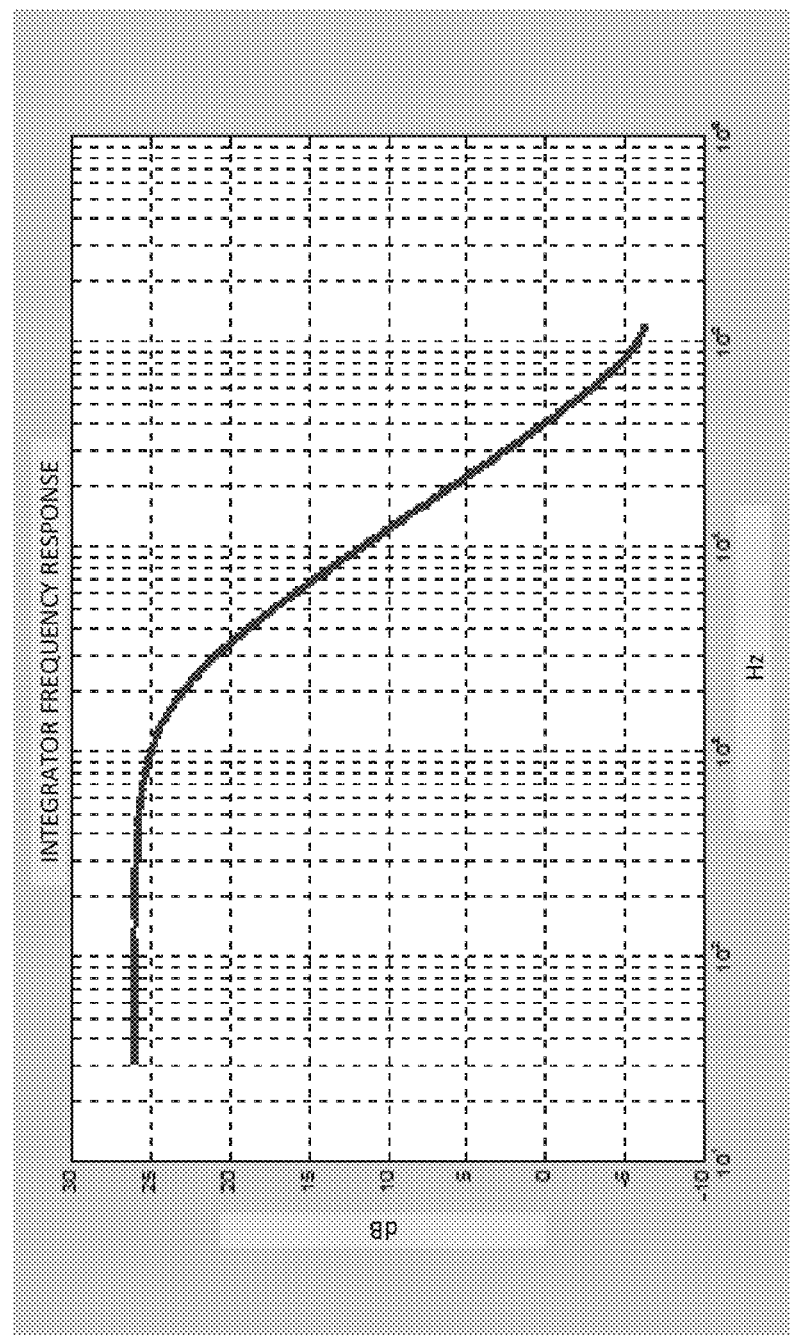
FIG. 3 is a graph illustrating an integrator frequency response, according to an embodiment of the present invention.

The gain $y_n$ plotted versus N is shown in FIG. 2, and $H_z$ versus frequency using the MATLAB™ freqz function is shown in FIG. 3 for arbitrary values of C1=C2 (10 pF), C3 (0.5 pF) and $T_{chop}$ (4 us). The bandwidth for $T_{chop}$=4 us and the above capacitor values is about 2 kHz. Longer $T_{chop}$ intervals will lower the bandwidth. The thermal noise in 2 kHz can still overwhelm a tiny input signal (e.g. from a thermopile sensor which can have a relatively high output resistance). Thus, the integrator output can be averaged to accomplish further noise reduction. This can be accomplished digitally with an ADC.

In another embodiment, counter 120 can be disabled from counting and if register 125 is loaded with a value less than or greater than counter 120's output, comparator 130 will never output a logic one indicating equality of its inputs (A, B). In this new embodiment, the GCI never enters hold mode and is never reset so that it operates continuously as a discrete time low pass filter. The output of the GCI 100 is then a periodic waveform switching between ideally 0V and the value $y_n$ with a period equal to $F_{chop}$. This embodiment could be a simpler implementation (i.e. without a counter, register and comparator) for a single channel input as long as the ADC digitizing the GCI output performed an averaging function which would produce an average value over enough samples.

Figure 4:
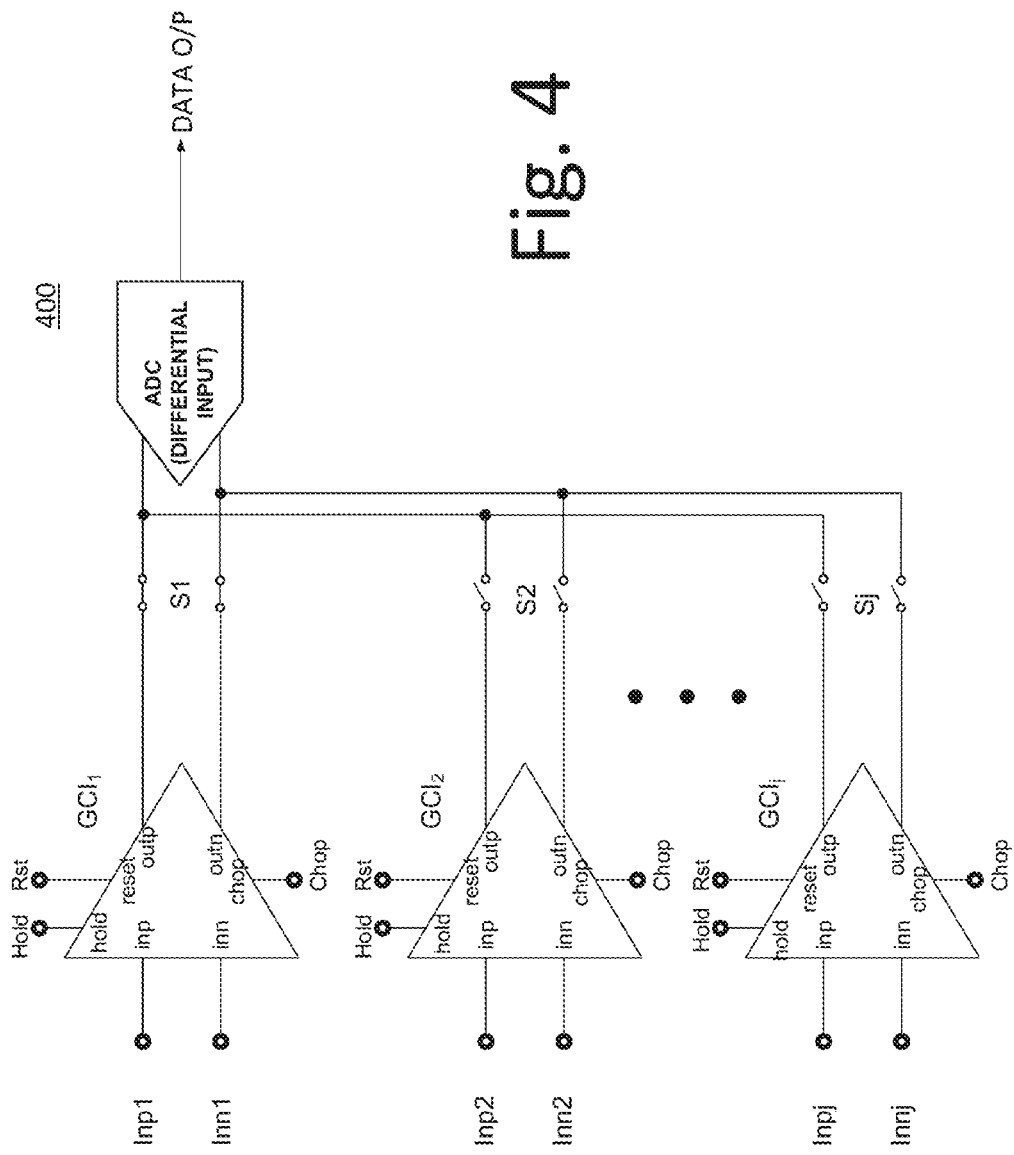
FIG. 4 is a block diagram illustrating a plurality of GCIs to simultaneously process multiple input signals, according to an embodiment of the present invention.

In another embodiment, a plurality of $GCI_1$, $GCI_2$ ... $GCI_j$, as illustrated in FIG. 4, can be arranged to simultaneously process multiple signal inputs with high gain, low offset and noise. $GCI_1$, $GCI_2$ ... $GCI_j$ may be operated in a count-compare-hold mode and when a value N is reached, all $GCI_1$, $GCI_2$ ... $GCI_j$ can enter hold mode simultaneously. A digitizer may then digitize the output for each $GCI_1$, $GCI_2$ ... $GCI_j$ in turn by connecting the appropriate pair of switches S1, S2 ... Sj to the digitizer after all other switch pairs are opened. This allows one digitizer to convert the outputs of multiple $GCI_1$, $GCI_2$ ... $GCI_j$, which all entered hold mode at the same instant so that a frame of data can be acquired which is useful in image processing. The use of a single digitizer saves power, die area, and cost in addition to eliminating mismatches that would be present if multiple digitizers were used.

It will be readily understood that the components of various embodiments of the present invention, as generally described and illustrated in the figures herein, may be arranged and designed in a wide variety of different configurations. Thus, the detailed description of the embodiments of the present invention, as represented in the attached figures, is not intended to limit the scope of the invention as claimed, but is merely representative of selected embodiments of the invention.

The features, structures, or characteristics of the invention described throughout this specification may be combined in any suitable manner in one or more embodiments. For example, reference throughout this specification to "certain embodiments," "some embodiments," or similar language means that a particular feature, structure, or characteristic described in connection with the embodiment is included in at least one embodiment of the present invention. Thus, appearances of the phrases "in certain embodiments," "in some embodiment," "in other embodiments," or similar language throughout this specification do not necessarily all refer to the same group of embodiments and the described features, structures, or characteristics may be combined in any suitable manner in one or more embodiments.

It should be noted that reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

One having ordinary skill in the art will readily understand that the invention as discussed above may be practiced with steps in a different order, and/or with hardware elements in configurations that are different from those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

The invention claimed is:

1. An apparatus, comprising:
   a modulator preceding a linear amplifier such that offset or noise present in a signal path between the modulator and a demodulator input is translated to a higher out of band frequency; wherein the demodulator comprises a CDS-integrator configured to demodulate a signal present at an output of the linear amplifier, after a counter and the CDS-integrator are reset and a first switch is closed.

2. The apparatus of claim 1, wherein the linear amplifier is between the modulator and a first capacitor, wherein the first capacitor precedes the first switch.

3. The apparatus of claim 1, further comprising:
   a second switch in series with a second capacitor and a third switch in parallel with a third capacitor, both switch-capacitor networks in parallel in a feedback loop of a transconductance amplifier, wherein the second switch and the third switch are turned on to reset the CDS-integrator when the counter is reset.

4. The apparatus of claim 3, wherein the first switch and the third switch are opened and the second switch is closed, when the counter reaches a predefined value.

5. The apparatus of claim 4, wherein the CDS-integrator is configured to accumulate charge on a second capacitor, to partially deplete the charge on the second capacitor with the third capacitor and hold an accumulated charge on the second capacitor and the third capacitor when the counter reaches the predefined value.

6. The apparatus of claim 4, wherein the predefined value is a number of cycles for which the CDS-integrator integrates and the second switch and third switch are controlled with non-overlapping clock signals to accumulate charge on the second capacitor and to partially deplete the charge on the second capacitor with the third capacitor.

7. An apparatus, comprising:
a Gated CDS Integrator configured to filter a chopped signal with correlated double sampling and discrete time lossy integration to reduce offset, 1/f, Johnson, and shot noise, wherein
the Gated CDS Integrator is further configured to digitally control discrete time amplification, and demodulate and filter the chopped signal; wherein the Gated CDS Integrator further comprises
a comparator configured to compare an output of a counter and a register, and when an output of the counter and an output of the register are same, output a logic signal to open a first switch and a third switch and close a second switch, allowing a voltage to be held for digitizing.

8. The apparatus of claim 7, wherein the Gated CDS Integrator comprises
a modulator configured to further chop the chopped signal into a square wave with a period, translating an input signal up to harmonics of a chop clock frequency, wherein the period alternates between an input voltage and a reference voltage.

9. The apparatus of claim 8, wherein the modulator precedes a linear amplifier to reject any offset and/or 1/f noise present in a signal path between the modulator and a correlated double sampling integrator.

10. The apparatus of claim 7, wherein the register is loaded with an integer value on a rising edge of a logic signal load.

11. The apparatus of claim 7, wherein the counter is configured to count a number of chopper clock cycles after being reset.

12. The apparatus of claim 7, wherein, when digitizing is complete, the comparator is further configured to output a logic signal to force the second switch and third switch to close, allowing the held voltage to be discharged.

13. The apparatus of claim 7, wherein, when the Gated CDS integrator operates under a correlated double sampling integration mode, a first switch is closed and the chopped signal is toggled between a second switch and a third switch with non-overlapping intervals.

14. The apparatus of claim 13, wherein when the chop signal is a logic 1, the third switch is closed and the second switch is open, and an output of a transconductance amplifier is equal to zero volts plus an offset voltage equal to an input voltage.

15. A Gated CDS Integrator, comprising:
a modulator preceding a linear amplifier to reject any offset or 1/f noise present in a signal path between the modulator and a correlated double sampling integrator; wherein when a counter and correlated double sampling integrator are reset, a first switch is closed and the correlated double sampling integrator is configured to demodulate a signal present at an output of the linear amplifier.

16. The Gated CDS Integrator of claim 15, wherein the linear amplifier is between the modular and a first capacitor.

* * * * *